United States Patent
Strickling et al.

(10) Patent No.: US 12,061,232 B2
(45) Date of Patent: Aug. 13, 2024

(54) MARGIN TEST DATA TAGGING AND PREDICTIVE EXPECTED MARGINS

(71) Applicant: Tektronix, Inc., Beaverton, OR (US)

(72) Inventors: Sam J. Strickling, Portland, OR (US); Daniel S. Froelich, Portland, OR (US); Michelle L. Baldwin, Mount Juliet, TN (US); Jonathan San, Palo Alto, CA (US); Lin-Yung Chen, New Taipei (TW)

(73) Assignee: Tektronix, Inc., Beaverton, OR (US)

( * ) Notice: Subject to any disclaimer, the term of this patent is extended or adjusted under 35 U.S.C. 154(b) by 292 days.

(21) Appl. No.: 17/402,382

(22) Filed: Aug. 13, 2021

(65) Prior Publication Data
US 2022/0091185 A1 Mar. 24, 2022

Related U.S. Application Data

(60) Provisional application No. 63/081,265, filed on Sep. 21, 2020.

(51) Int. Cl.
*G01R 31/317* (2006.01)
*G01R 31/01* (2020.01)
*G06F 11/273* (2006.01)

(52) U.S. Cl.
CPC ....... *G01R 31/31715* (2013.01); *G01R 31/01* (2013.01); *G01R 31/31713* (2013.01); *G06F 11/2733* (2013.01)

(58) Field of Classification Search
None
See application file for complete search history.

(56) References Cited

U.S. PATENT DOCUMENTS

| | | | |
|---|---|---|---|
| 5,243,273 | A | 9/1993 | MacAuliffe |
| 6,351,827 | B1 | 2/2002 | Co et al. |
| 6,449,742 | B1 | 9/2002 | Arabi |
| 6,765,877 | B1 | 7/2004 | Foschiano |

(Continued)

FOREIGN PATENT DOCUMENTS

| | | |
|---|---|---|
| JP | 2012118002 | 6/2012 |
| KR | 20180006480 | 1/2018 |

(Continued)

OTHER PUBLICATIONS

Timothy Lyons et al., "The Implementation and application of a protocol aware architecture" 2013 IEEE International Test Conference (ITC), Sep. 6, 2013, pp. 1-10, IEEE, Anaheim, California.

(Continued)

*Primary Examiner* — Jermele M Hollington
(74) *Attorney, Agent, or Firm* — Miller Nash LLP; Andrew J. Harrington

(57) ABSTRACT

A margin tester including an identification reader configured to receive an adaptor identifier of an adaptor, an interface configured to connect to a device under test through the adaptor, and one or more processors configured to assess a margin, such as an electrical margin or an optical margin, of a device under test and tag the assessment with the adaptor identifier. Assessing the margin can include assessing the margin based on an expected margin that is predicted or provided based on the adaptor identifier.

20 Claims, 3 Drawing Sheets

(56) References Cited

U.S. PATENT DOCUMENTS

| | | |
|---|---|---|
| 7,099,438 B2 | 8/2006 | Rancu |
| 7,139,949 B1 | 11/2006 | Jennion |
| 7,398,514 B2 | 7/2008 | Ulrich |
| 7,941,718 B2 | 5/2011 | Zhang |
| 9,042,427 B2 | 5/2015 | Singh |
| 10,255,151 B1 | 4/2019 | Levin |
| 11,782,809 B2 * | 10/2023 | Strickling .............. G01R 31/30 714/37 |
| 2004/0078740 A1 | 4/2004 | Cook |
| 2004/0133834 A1 | 7/2004 | Kanemitsu |
| 2004/0176924 A1 | 9/2004 | Salmon |
| 2006/0184332 A1 | 8/2006 | Ishida |
| 2008/0192814 A1 | 8/2008 | Hafed |
| 2009/0010171 A1 | 1/2009 | Gupta |
| 2009/0261807 A1 | 10/2009 | Sawara |
| 2010/0153052 A1 | 6/2010 | Schmitz |
| 2010/0313089 A1 | 12/2010 | Rajski |
| 2011/0187400 A1 | 8/2011 | Watanabe |
| 2011/0257953 A1 | 10/2011 | Li |
| 2012/0245879 A1 | 9/2012 | Mikkola |
| 2013/0033285 A1 | 2/2013 | McMahon |
| 2013/0145212 A1 | 6/2013 | Hsu |
| 2014/0112339 A1 | 4/2014 | Safranek |
| 2014/0229666 A1 | 8/2014 | Schoenborn |
| 2015/0067207 A1 | 3/2015 | Iyer |
| 2016/0087822 A1 | 3/2016 | Kossel |
| 2016/0266204 A1 | 9/2016 | Chandra |
| 2017/0019247 A1 | 1/2017 | Iyer |
| 2018/0045781 A1 | 2/2018 | Song |
| 2018/0091358 A1 | 3/2018 | Sasaki |
| 2018/0285225 A1 | 4/2018 | Kumar |
| 2019/0067056 A1 | 2/2019 | Shen |
| 2020/0025824 A1 | 1/2020 | Zhao |
| 2020/0249275 A1 * | 8/2020 | Froelich .............. G06F 13/4068 |
| 2020/0250368 A1 * | 8/2020 | Froelich .................. H04L 43/50 |
| 2021/0405108 A1 * | 12/2021 | Strickling .......... G01R 31/2808 |
| 2021/0406144 A1 * | 12/2021 | Strickling ................ G06F 11/26 |
| 2022/0163588 A1 * | 5/2022 | Froelich ......... G01R 31/318572 |
| 2022/0317181 A1 | 10/2022 | Sakare |

FOREIGN PATENT DOCUMENTS

| | | |
|---|---|---|
| TW | I342403 | 5/2011 |
| TW | I440858 | 6/2014 |

OTHER PUBLICATIONS

Salem Abdennadher et al., Practices in High-Speed IO Testing, 2016 21th IEEE European Test Symposium (ETS), May 23, 2016, p. 1-8, IEEE, Amsterdam, Netherlands.

* cited by examiner

MARGIN TEST DATA TAGGING AND PREDICTIVE EXPECTED MARGINS

PRIORITY

This disclosure claims the benefit of U.S. Provisional Application No. 63/081,265, titled "MARGIN TEST DATA TAGGING AND PREDICTIVE EXPECTED MARGINS," filed on Sep. 21, 2020, the disclosure of which is incorporated herein by reference in its entirety.

TECHNICAL FIELD

This disclosure relates to test and measurement systems, and more particularly to systems and methods for performing high-speed margin tests on an electrical device-under-test (DUT).

BACKGROUND

Test and measurement instruments sometimes connect to DUTs through one or more accessories or adaptors. However, accessories or adaptors can affect the transmission of signals from and to the test and measurement instrument, which can cause errors in tests performed by the test and measurement instrument. The accessories and adaptors may also only be capable of measuring a certain range of margins, resulting in potential errors when measuring margins outside that range.

To remove the effects of the accessories or adapters, the accessories or adaptors used to connect the test and measurement instrument to a DUT can be de-embedded from the test results. However, de-embedding the cables and fixtures required measuring the cables and fixtures and determining the de-embed parameters. This can take days for a user to perform and is prone to errors, especially at higher data rates and frequencies.

Examples of the disclosure address these and other deficiencies of the prior art.

BRIEF DESCRIPTION OF THE DRAWINGS

Aspects, features and advantages of examples of the present disclosure will become apparent from the following description of examples in reference to the appended drawings in which.

DESCRIPTION

A margin tester or system is a test and measurement instrument that can perform high-speed margin tests, such as, but not limited to, electrical margin tests and optical margin tests, on a DUT. A margin tester can establish a single-lane or multi-lane high speed input/output link of a DUT to assess a margin of either the single-lane or each lane of the multi-lane high speed input/output link in either or both the transmitting direction or the receiving direction.

U.S. patent application Ser. No. 16/778,249 and U.S. patent application Ser. No. 16/778,262, each filed Jan. 31, 2020, and published respectively as U.S. Pre-Grant Publ. No. 2020/0250368 and U.S. Pre-Grant Publ. No. 2020/0249275, each of which is incorporated in reference in its entirety, disclose systems and methods for performing high-speed margin tests on a DUT. Such margin testers may be particularly useful for testing DUTs that employ multi-lane communication protocols such as Peripheral Component Interconnect (PCI) Express, universal serial bus (USB), serial AT attachment (SATA), double data rate (DDR), or serial attached SCSI (SAS), for example.

Figure 1:
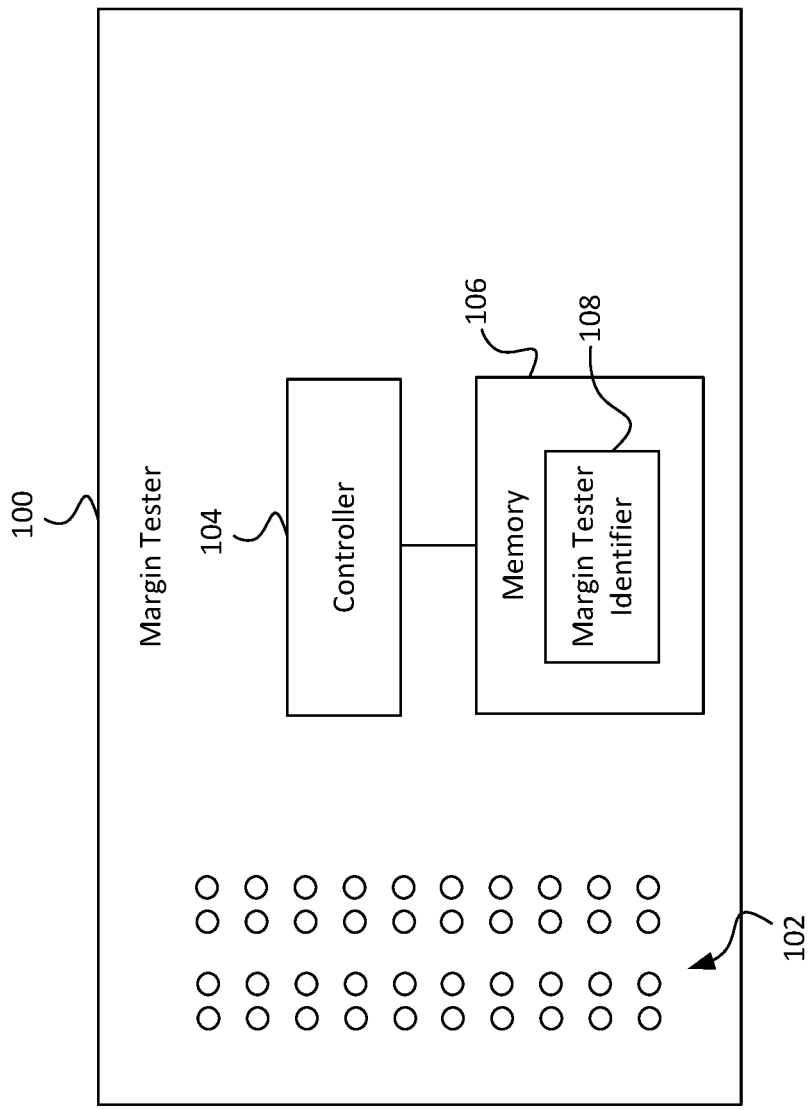
FIG. 1 is a block diagram of a margin tester according to examples of the disclosure.

FIG. 1 is a block diagram illustrating a margin tester 100 with a number of interfaces 102 configured to be connected, e.g., via one or more cables, to at least one test fixture to assess the margin of the multi-lane high speed I/O link of the DUT in either or both transmit and receive directions, according to an example of the disclosure.

The margin tester 100 includes a controller 104 comprised of one or more processors and associated memory 106 in communication therewith, which may store instructions and other data that the controller 104 may read, use and/or execute to perform the functions described herein. The margin tester 100 may include some number of lanes that can be connected, e.g., cabled, to standard test fixtures, cables, or adaptors via interfaces 102 to carry out, under control of the controller 104, margin testing. The margin tester 100 includes transmitters and/or receivers (not shown) connected to the interfaces 102.

The controller 104 may be configured to assess the margin of the single-lane or multi-lane high speed input/output (I/O) link by at least being configured to inject reduction of eye width opening by injecting jitter or other patterns on margin test transmitters (or implementing other eye width opening reduction methods), the injection of jitter being selectable to be applied on all lanes of the single-lane or multi-lane high speed I/O link simultaneously or applied independently per lane of the of the single-lane or multi-lane high speed I/O link. Also, the controller 104 may be configured to assess the margin of the single-lane or multi-lane high speed I/O link by at least being configured to inject reduction of eye height opening by injecting noise on margin tester 100 transmitters (or implementing other eye height opening reduction methods), the injection of noise being selectable to be applied on all lanes of the single-lane or multi-lane high speed I/O link simultaneously or applied independently per lane of the of the single-lane or multi-lane high speed I/O link.

The margin tester 100 can support multiple protocols and the configuration of the controller 104 of the margin tester 100 includes options to configure the lanes for different protocols and host/device roles. The margin tester 100 may also be used to test add-in cards by cabling to test fixtures, including the standard PCI Express Compliance Base Board (CBB) for testing add-in cards.

During assessing the margin, the controller 104 can compare the measured margin of a DUT with an expected margin. A DUT may need to exceed a certain margin to be considered minimally compliant. However, the margin that needs to be exceeded can vary based on the effects of the margin tester and any adaptors or accessory attached between the margin tester and the DUT.

The controller 104 may also be coupled to memory 106, which may store instructions and other data the controller 104 may read, use and/or execute to perform the functions described herein. For example, the memory 106 may store a margin tester identifier 108 of the margin tester 100. The margin tester identifier 108 can be any unique identifier, such as, but not limited to, a serial number of the margin tester 100. The memory 106 may also store any expected margins for the DUT.

Figure 2:
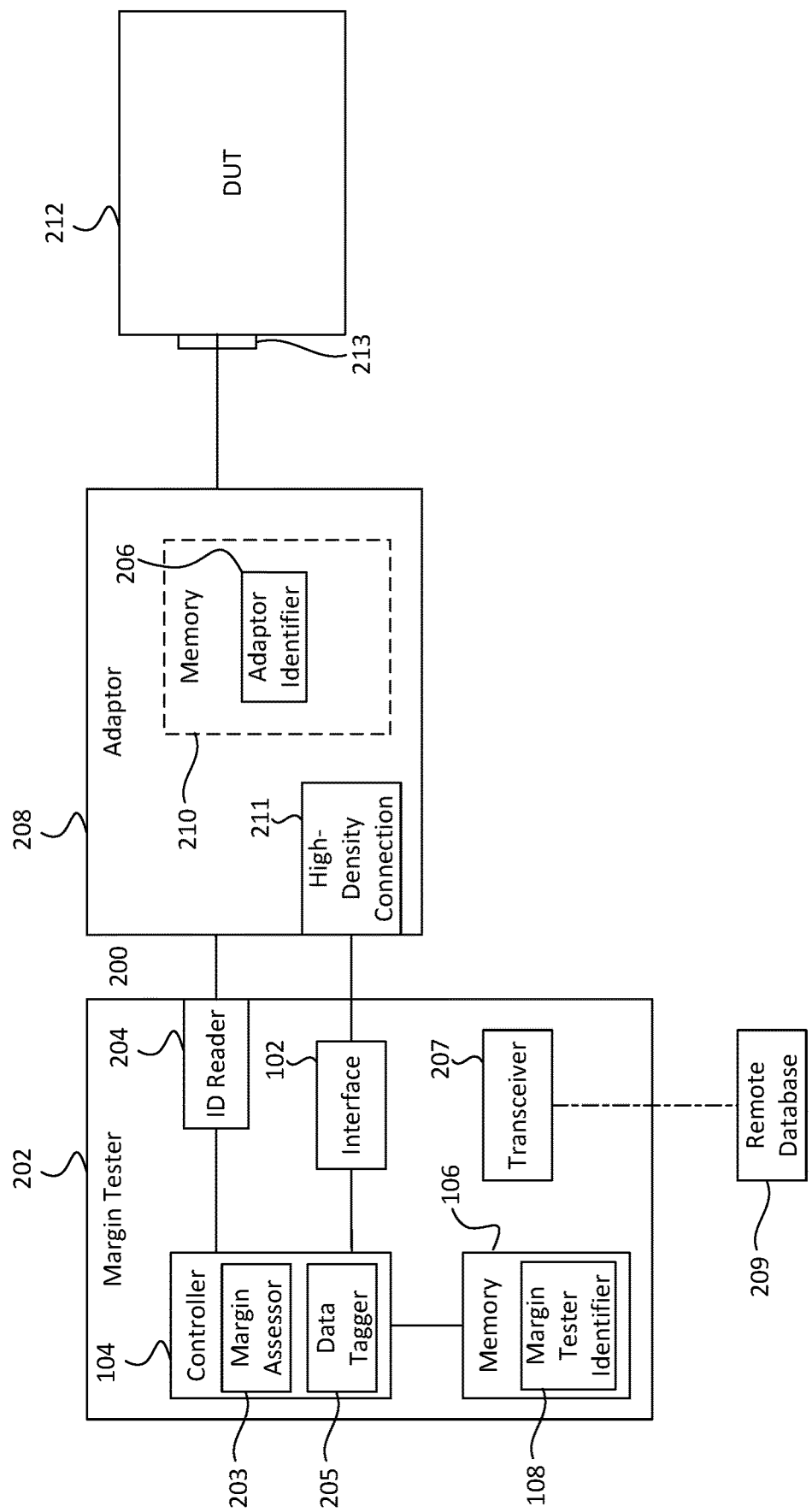
FIG. 2 is a block diagram of a test and measurement system according to some examples of the disclosure.

The interfaces 102 of the margin tester 100 may include standard co-axial connectors and cables for each high speed differential signal or, in various other embodiments, include custom high density connectors and fixtures to minimize the cable count and make switching from one DUT to another DUT more efficient. For example, a high-density connector adaptor to connect to a specific mechanical form-factor of a DUT can be used to connect to the margin tester 100 to the DUT. An example of a specific mechanical form-factor 213, e.g., as illustrated in FIG. 2, may be a specific type of PCI Express motherboard slot. That is, the adaptor may have one end that connects to the interface 102 of the margin tester 100 and another end that is a specific type of PCI Express motherboard slot. A high-density adaptor can be any adaptor that has eight or more connection points.

FIG. 2 illustrates an example of a test and measurement system 200 according to some examples of the disclosure. Margin tester 202 can be the same or similar to the margin tester 100 discussed above with respect to FIG. 1 and may include any or all of the features of the margin tester 100. In FIG. 2, the controller 104 of the margin tester 202 is shown implementing the functions of a margin assessor 203 and a data tagger 205. The margin tester 202 may also additionally include an identification reader 204 for reading an adaptor identifier 206 of an adaptor 208. The adaptor identifier 206 may be stored in an optional memory 210 of the adaptor 208 in some examples, as shown in FIG. 2. The memory 210 may be, for example, a read-only memory used to store the adaptor identifier 206. However, examples of the disclosure are not limited to this type of memory and other memories may be used. The adaptor 208 also connects to a mechanical form-factor 213 of a device under test 212.

The adaptor identifier 206 does not have to be stored in a memory 210. In some examples, the adaptor 208 may include a unique set of mechanical pins on a portion of the adaptor 208 that connects to the margin tester 202. The unique set of mechanical pins provide a unique identifier for the adaptor identifier 206 of the adaptor 208. The adaptor 208 could also include an RFID tag with the adaptor identifier 206 stored thereon. That is, the adaptor identifier 206 can be any sort of unique identifier that can be read by an identification reader 204 of the margin tester 2020.

The identification reader 204 of the margin tester 202 can determine the adaptor identifier 206 of the adaptor 208. The identification reader 204 may be any type of reader than can receive or read the adaptor identifier 206, such as a serial interface, RFID reader, or a mechanical reader that can determine the adaptor identifier 206 by the mechanical pins of the adaptor 208, if used.

The identification reader 204 can send the adaptor identifier 206 to the controller 104. Using the data tagger 205, the controller 104 of the margin tester 202 can tag all the margin data with the margin tester identifier 108 and the adaptor identifier 206 of the adaptor 208. If the identification reader 204 is not able to read or determine the adaptor identifier 206 of the adaptor 208, such as if the adaptor 208 does not have a adaptor identifier 206, then the data can also be tagged marking that an unknown adaptor 208 was used during the test.

Based on the adaptor identifier 206 of the adaptor 208, a controller, such as controller 104 or a remote controller, such as within a cloud system, can determine expected margins of the test system 200 based on both the margin tester identifier 108 and the adaptor identifier 206 of the adaptor 208. This may involve use of the margin assessor 203.

The expected margins may be stored within the memory 106 of the margin tester 100 or they may be retrieved from a remote database 209, such as a cloud database, either through the internet, a local network connection, or a wired connection, using a transceiver 207. If not already stored within the memory 106, the expected margin can be stored within the memory 106 of the margin tester 100 when received.

There are a number of different processes that can be used to determine the expected margins for the test system 200 based on the adaptor identifier 206 of the adaptor 208 and the margin tester identifier 108 of the margin tester 202. In the most straightforward example of the disclosure, during factory calibration, expected margins for testing minimally compliant devices are established for a specific margin tester and adaptor pairing with a particular type of DUT. The established margins for the specific margin tester and adaptor pairing with the particular type of DUT can then be saved as expected margins.

During testing, multiple DUTs 212 of the particular type may be tested using the specific factory-calibrated margin tester 202 and adaptor 208 pairing. The expected margins determined at the factory based on the specific margin tester 202 and adaptor pairing 208 can be used by the margin assessor 203 to evaluate the results of the tests of the multiple DUTs 212 of the particular type. The expected margins may be stored within the memory 106 of the margin tester 100 or may be retrieved from a remote database 209 based on the margin tester identifier 108 of the margin tester 100 and/or the adaptor identifier 206 of the adaptor 208. The data collected during the test is tagged with one or both of the margin tester identifier 108 and the adaptor identifier 206.

If the adaptor 208 is unknown, then the expected margin can be set based on the margin tester identifier 108 of the margin tester 202 alone or may be set based on a user input. Data collected and analyzed using the unknown adaptor 208 is tagged by the data tagger 205 as an unknown adaptor 208 and with the margin tester identifier 108 of the margin tester 202. This can allow a user to readily assess the data collected with the unknown adaptor 208.

However, factory-calibrating each specific margin tester 200 and adaptor 208 for a particular DUT type can be time consuming, especially if multiple margin testers 200 and adaptors 208 are present in the test system 200. In some examples, rather than determining the exact expected margins for a specific margin tester and adaptor pairing, predictive analysis may be used to predict what the expected margin is for a particular type of DUT 212 based on normalized factory calibration.

For example, in some examples of the disclosure, multiple adaptors 208 can be factory tested with the same margin tester 200 and same particular type of DUT. That is, during factory calibration, different adaptors 208 are tested with the same margin tester 200 and the same particularly type of DUT 212 and the margins with each adaptor 208 can be recorded in a database, along with the adaptor identifier 206 of each adaptor 208. When a particular adaptor 208 is used with the same type of DUT and a different margin tester 202, the expected margins may be predicted based on the initial factory testing of the adaptor 208 with a different margin tester 202. In some examples, the predicted expected margin may be set based on known characteristics of the margin tester 202 used in the particular test and the expected margins measured with the adaptor 208 with the factory margin tester 202.

Additionally or alternatively, a number of different margin testers 202 are factory tested with the same adaptor 208 and the same particular type of DUT 212. The expected margins for each margin tester 202 can be recorded, along with the margin tester identifier 108 of the margin tester 202. As long as the same type of adaptor 208 is used when testing each DUT 212 of the particular type, the expected margin can be set based on the margin tester identifier 108 of the margin tester 200. In such an example, the adaptor identifier 206 of the specific adaptor 208 used is still recorded and tagged with the data. In some examples, the predicted expected margin may be set based on known characteristics of the adaptor 208 used in the particular test and the expected margins measured with the factor adaptor 208 and the margin tester 202.

Additionally or alternatively, a variety of different "first" and "second" (or more) margin testers 202 and adaptors 208 can be tested at the factory with the same type of DUT 212. The biggest outliers of the margin testers 202 and the adaptors 208 are tested directly and these tests can be used to set the expected margins for the particular type of DUT 212 when performing testing of those types of DUTs 212.

Examples of the disclosure, however, are not limited to direct measurements of a particular type of DUT 212 with a margin tester 202 and an adaptor 208 to determine the expected margins. In other examples, the adaptor 208 could be measured directly with a vector network analyzer and/or the margin tester 202 could be measured with an oscilloscope or bit error rate testers. The variations in measurement between the adaptors 208 can be used to determine the variations in the expected margins. Further, the variations in measurements between the margin testers 202 can be used to determine the variations in the expected margins. For instance the length of cable used between a factory margin tester 202 and a lab margin tester 202 could be different.

Figure 3:
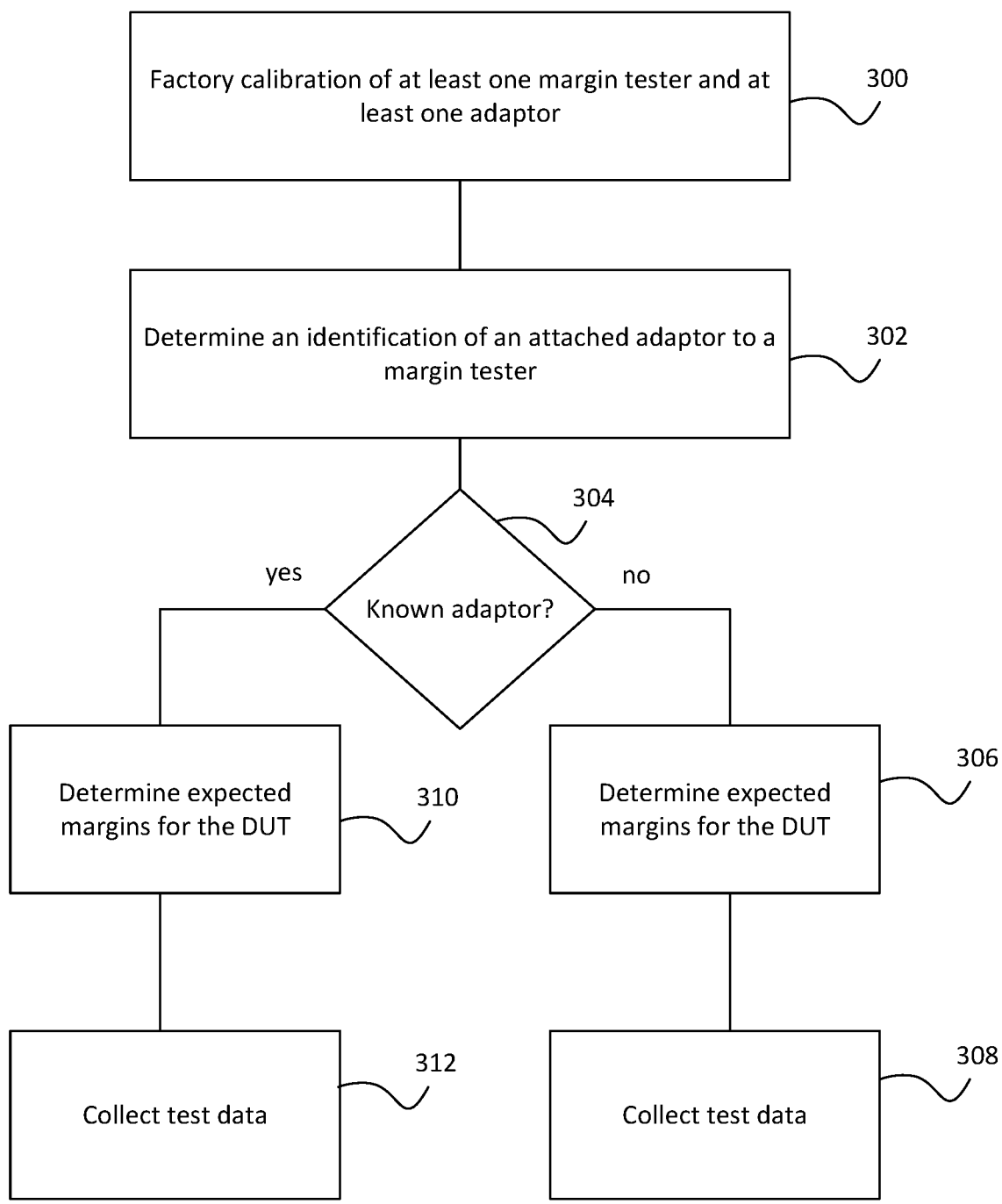
FIG. 3 is a flow chart illustrating a process of the test and measurement instrument according to some examples of the disclosure.

FIG. 3 is a flow chart according to some examples of the disclosure. Initially, at the factory, some form of calibration is performed in operation 300. The calibration can include any of the calibration processes discussed above. For example, the calibration can include calibrating a specific margin tester and adaptor pairing with a particular type of DUT 212. In other examples, a particular type of DUT 212 and a specific margin tester 202 may be tested with a number of different adaptors 208. In further examples, a particular type of DUT 212 and a specific adaptor 208 may be tested with a number of different margin testers 200. In yet other examples, different combinations of margin testers 200 and adaptors 208 can be tested with a particular type of DUT 212.

Then, during testing, in operation 302, an identification reader 204 of a margin tester 202 can read or determine an adaptor identifier 206 of the adaptor 208. In operation 304, it can be determined whether the adaptor 208 is a known adaptor 208. In some examples, in addition to determining whether the adaptor 208 is known in operation 304, the health of the adaptor 208 and/or cable may be determined as well, such as taught in U.S. patent application Ser. No. 17/386,384, titled "CABLE CONDITION INDICATOR," filed Jul. 27, 2021, and published as U.S. Pre-Grant Publ. No. 2022/0034975, which is incorporated by reference herein its entirety. The controller 104 can determine if it the identification reader 204 is unable to read an adaptor identifier 206 of the adaptor 208. If the identification reader 204 can read an adaptor identifier 206, the controller 104 can either compare the adaptor identifier 206 to known identifiers stored in memory 106 or cause the adaptor identifier 206 to be transmitted by a transceiver 207 to a remote database 209 to determine if the adaptor identifier 206 is known.

If the adaptor identifier 206 is unknown, then in operation 306, the controller 104 of the margin tester can determine an expected margin based either on a user input or based on the margin tester identifier 108, as well as cable health if determined or included. The controller 104 can determine the expected margin directly or may use an expected margin retrieved from a remote database 209. In operation 308, the margin tester 202 can collect data from the DUT 212 and tag the data to indicate it was collected with an unknown adaptor 208.

If the adaptor 208 is known, then the controller 104 can still determine the expected margins for the DUT 212, but can do so using the adaptor identifier 206 of the adaptor 208, and the cable health, if included in operation 310. The controller 104 may either retrieve from memory 106 the expected margins based on the adaptor identifier 206, or the controller 104 may cause the adaptor identifier 206, and additionally the margin tester identifier 108 in some examples, to be transmitted by the transceiver 207 to a remote database 209 which can then determine the expected margins based off the known adaptor 208 and the margin tester 202.

Using the expected margins, the controller 104 can assess the margins of the DUT 212 using the margin assessor 203 and, using the data tagger 205, the controller 104 can tag the data with the adaptor identifier 206 of the adaptor 208. In some examples, the controller 104 can also tag the data with the margin tester identifier 108 of the margin tester 202. In operation 312, the margin tester 202 can collect data from the DUT 212 and tag the data to indicate it was collected with a known adaptor 208, and any other information, such as cable health.

Examples of the disclosure can use known characteristics of particular test equipment, such as margin testers 202 and/or adaptors 208 to provide more accurate test results for a DUT 212. The data collected by the controller 104 can be displayed to a user and a user will readily be able to tell which data was collected with a known adaptor 208 and which data was not. A user can be confident that data collected with a known adaptor 208 is accurate and has taken into account the characteristics of the adaptor 208 and the margin tester 202. This eliminates hours of manual labor, which may be error prone, for determining de-embed parameters of adaptors within a system.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. A configuration of the technologies may include any one or more, and any combination of, the examples described below.

Example 1 a margin tester, comprising an identification reader configured to receive an adaptor identifier of an adaptor; an interface configured to connect to a device under test through the adaptor; and one or more processors configured to assess a margin of a device under test and tag the assessment with the adaptor identifier.

Example 2 is the margin tester of example 1, further comprising a memory configured to store a margin tester identifier.

Example 3 is the margin tester of example 2, wherein the one or more processors are further configured to tag the data with the margin tester identifier.

Example 4 is the margin tester of either one of examples 2 or 3, wherein the one or more processors are further configured to determine an expected margin for the device under test based on the margin tester identifier.

Example 5 is the margin tester of any one of examples 1-4, wherein the one or more processors are further configured to determine an expected margin for the device under test based on the adaptor identifier.

Example 6 is the margin tester of any one of examples 1-5, wherein the adaptor is a high-density adaptor and connects to the interface through a high-density connection.

Example 7 is the margin tester of any one of examples 1-6, wherein the adaptor connects to the device under test through a mechanical form-factor.

Example 8 is the margin tester of any one of examples 1-7, further comprising a transceiver configured to transmit the adaptor identifier to a remote database and receive an expected margin for the device under test based on the adaptor identifier.

Example 9 is a method for margin testing a device under test, comprising receiving an adaptor identifier at a margin tester; determining whether an adaptor is a known adaptor based on the adaptor identifier; assessing a margin of a device under test through the adaptor; and tagging assessment data of the margin of the device under test with the adaptor identifier.

Example 10 is the method of example 9, further comprising storing a margin tester identifier.

Example 11 is the method of example 10, further comprising tagging the assessment data with the margin tester identifier.

Example 12 is the method of either one of examples 10 or 11, further comprising determining the expected margin for the device under test based on a margin tester identifier.

Example 13 is the method of any one of examples 9-12, further comprising determining an expected electrical margin for the device under test based on the adaptor identifier.

Example 14 is the method of example 13, wherein determining the expected margin includes determining the expected margin based on a factory calibration of the margin tester and the adaptor.

Example 15 is the method of example 13, wherein the margin tester is a first margin tester and determining the expect margin includes determining the expected margin based on a factory calibration of the adaptor and a second margin tester.

Example 16 is the method of example 13, wherein determining the expected margin includes predicting the expected margin based on factory calibration of a number of combinations of different adaptors and margin testers.

Example 17 is the method of example 13, wherein determining the expected margin includes retrieving the expected margin from a remote database.

Example 18 is a margin tester, comprising an identification reader configured to receive an adaptor identifier of a high-density adaptor; an interface configured to connect to a device under test through the adaptor; a margin assessor configured to assess a margin of a device under test; and a data tagger configured to tag the assessment with the adaptor identifier.

Example 19 is the margin tester of example 18, wherein the margin assessor is further configured to determine an expected margin for the device under test based on the adaptor identifier.

Example 20 is the margin tester of either one of examples 18 or 19, wherein the adaptor connects to the interface through a high-density connection.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that all features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. A margin tester, comprising:
an identification reader that receives an adaptor identifier of an adaptor;
an interface that connects to a device under test through the adaptor; and
one or more processors that:
assess a margin of the device under test to produce assessment data; and
tag the assessment data with the adaptor identifier.

2. The margin tester of claim 1, further comprising a memory in communication with the one or more processors and stores a margin tester identifier.

3. The margin tester of claim 2, wherein the one or more processors tag the assessment data with the margin tester identifier.

4. The margin tester of claim 2, wherein the one or more processors determine an expected margin for the device under test based on the margin tester identifier.

5. The margin tester of claim 1, wherein the one or more processors determine an expected margin for the device under test based on the adaptor identifier.

6. The margin tester of claim 1, wherein the adaptor is a high-density adaptor and connects to the interface through a high-density connection.

7. The margin tester of claim 1, wherein the adaptor connects to the device under test through a mechanical form-factor.

8. The margin tester of claim 1, further comprising a transceiver that transmits the adaptor identifier to a remote database and receives an expected margin for the device under test based on the adaptor identifier.

9. A method for margin testing a device under test, comprising:
receiving an adaptor identifier at a margin tester;
determining whether an adaptor is a known adaptor based on the adaptor identifier;
assessing a margin of a device under test through the adaptor; and
tagging assessment data of the margin of the device under test with the adaptor identifier.

10. The method of claim 9, further comprising storing a margin tester identifier.

11. The method of claim 10, further comprising tagging the assessment data with the margin tester identifier.

12. The method of claim 10, further comprising determining an expected margin for the device under test based on the margin tester identifier.

13. The method of claim 9, further comprising determining an expected margin for the device under test based on the adaptor identifier.

14. The method of claim 13, wherein determining the expected margin includes determining the expected margin based on a factory calibration of the margin tester and the adaptor.

15. The method of claim 13, wherein the margin tester is a first margin tester and determining the expected margin includes determining the expected margin based on a factory calibration of the adaptor and a second margin tester.

16. The method of claim 13, wherein determining the expected margin includes predicting the expected margin based on factory calibration of a number of combinations of different adaptors and margin testers.

17. The method of claim 13, wherein determining the expected margin includes retrieving the expected margin from a remote database.

18. A margin tester, comprising:
an identification reader that receives an adaptor identifier of a high-density adaptor;
an interface that connects to a device under test through the high-density adaptor;
a margin assessor that assesses a margin of the device under test and produces assessment data; and
a data tagger that tags the assessment data with the adaptor identifier.

19. The margin tester of claim 18, wherein the margin assessor determines an expected margin for the device under test based on the adaptor identifier.

20. The margin tester of claim 18, wherein the high-density adaptor connects to the interface through a high-density connection.

* * * * *